United States Patent [19]

Deicke et al.

[11] Patent Number: 4,617,510
[45] Date of Patent: Oct. 14, 1986

[54] TESTING INSTALLATION FOR ELECTRIC CIRCUITS OF A MOTOR VEHICLE

[75] Inventors: Axel Deicke, Baldham; Michael Tigges, Freising, both of Fed. Rep. of Germany

[73] Assignee: Bayerische Motoren Werke AG, Fed. Rep. of Germany

[21] Appl. No.: 538,802

[22] Filed: Oct. 5, 1983

[30] Foreign Application Priority Data

Oct. 7, 1982 [DE] Fed. Rep. of Germany ....... 3237164

[51] Int. Cl.$^4$ ............................................. G01R 31/02
[52] U.S. Cl. ............................................. 324/51
[58] Field of Search .................... 324/51, 406, 414; 340/641, 642; 307/10 LS

[56] References Cited

U.S. PATENT DOCUMENTS 3,428,888  2/1969  Nolte ..................................... 324/51
3,663,939  5/1972  Olsson .................................... 324/51

Primary Examiner—Reinhard J. Eisenzopf
Assistant Examiner—Jack B. Harvey
Attorney, Agent, or Firm—Craig & Burns

[57] ABSTRACT

A testing installation for electric circuits of a motor vehicle, in which input signals are converted in a common central control unit into output signals for switching different loads; the testing installation includes a generator which produces signals at least similar to the output signals of the control unit and feeds the same cyclically to the loads or the switches thereof; as a result, only the critical portion of the electric circuits is switched and the functioning ability thereof is tested optically or acoustically without further auxiliary means.

11 Claims, 1 Drawing Figure

U.S. Patent   Oct. 14, 1986   4,617,510
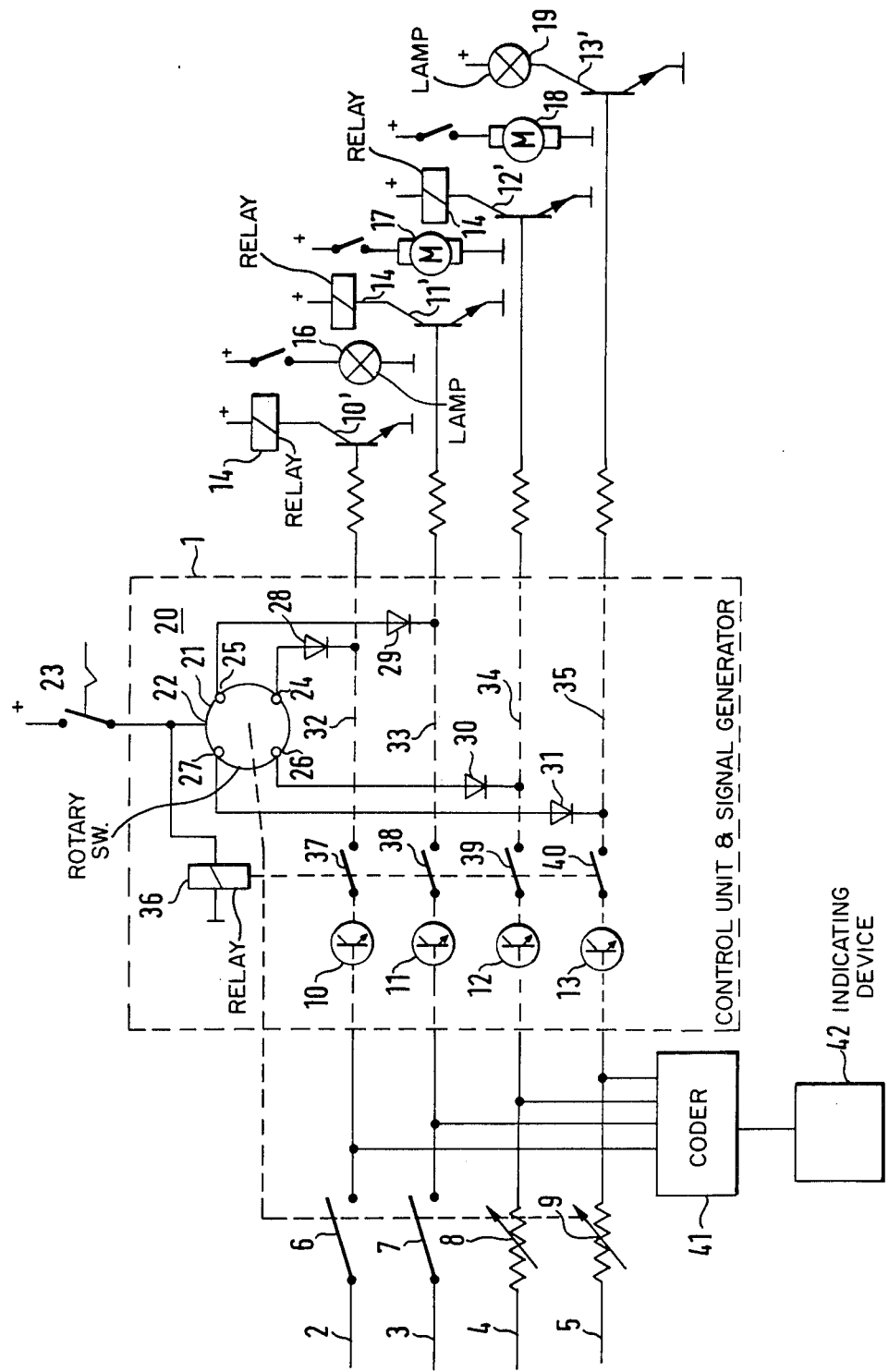

TESTING INSTALLATION FOR ELECTRIC CIRCUITS OF A MOTOR VEHICLE

BACKGROUND OF THE INVENTION

The present invention relates to a testing installation for electric circuits of a motor vehicle, in which input signals are converted in a common central control unit into output signals for switching different loads and the loads are switched independently of the input signals.

A testing installation of this type is known, in which an equivalent signal generator of the control unit supplies corresponding input signals. The output signals produced by the control unit can be fed selectively to the actual loads or equivalent loads. The testing is realized with the aid of a counter which determines the output signals of the control unit (see German Offenlegungsschrift No. 30 24 266). This testing installation is costly from a circuit point of view and requires additional structural parts, for example, in the form of equivalent loads.

The present invention is concerned with the task to provide a testing installation of the aforementioned type which enables a far-reachingly adequate testing of the electrical circuits in a simple manner from a circuit point of view and with only slight additional expenditures.

The present invention solves the underlying problems by a generator which produces signals at least similar to the output signals of the control unit and feeds the same cyclically to the loads or the switches thereof.

SUMMARY OF THE INVENTION

Basic for the present invention are essentially two considerations. On the one hand, errors in or failures of the electric circuits occur essentially during generation, and processing of the output signals. On the other hand, the manner of operation of the loads can be determined frequently without additional auxiliary means. The loads known under the designation of body electric system such as lighting-, signal- and cleaning-installations should be mentioned in that connection. Additionally, electrical loads associated with operation of the internal combustion engine, such as starter motor and fuel feed pump, belong thereto. According to the present invention, the portion of the electric circuits which is relatively less prone to troubles and which essentially includes the generation and reception of the input signals, is separated and only the part prone to troubles and failures is tested. The testing takes place exclusively on the basis of the manner of operation of the loads which are then engaged sequentially for short periods of time in case of a troublefree operation. Since the testing program is the same with identical vehicles, every deviation therefrom by reason of a load which operates incorrectly or which does not operate at all, can be recognized without difficulty and a corresponding service measure can be initiated.

A further simplification from a circuit point of view resides in that the generator is integrated into the control unit. This measure offers, particularly with the use of a microprocessor in the control unit, the additional advantage that it can be realized in a cost-favorable manner by a relatively slight additional programming.

A measure which has as its purpose the activation of the generator reduces circuit expenditures. This measure can be achieved in a particularly simple manner in that the generator is adapted to be actuated by a start test command. The cyclic control of the loads then takes place automatically and without further intervention.

It can be determined by the present invention whether an existing failure has occurred in that portion of the electric circuits which serves for the generation and processing of the output signals. However, if it is ascertained during this testing that a failure does not stem from this portion of the electric circuits, then by an additional measure, the portion of the electric circuits can be tested which is concerned with the input signals. More particularly, if the input signals can be represented on an indicating device, then a defective or nonexisting input signal can be recognized without difficulty, and the actually defective input signal can be identified among several possibly defective or incorrect input signals.

These and other objects, features and advantages of the present invention will become more apparent from the following description when taken in connection with the accompanying drawing which shows, for purposes of illustration only, one embodiment in accordance with the present invention.

BRIEF DESCRIPTION OF THE DRAWING

The single FIGURE is a schematic diagram of a testing installation in accordance with the present invention.

DESCRIPTION OF ILLUSTRATIVE EMBODIMENT

Referring now with the drawing, the testing installation illustrated in the single FIGURE is coordinated to electric circuits of a motor vehicle. A control unit 1 of any known construction is common to all of these electric circuits, in which the input signals are converted into output signals. The input signals reach the control unit 1 on parallel input lines, of which for the sake of simplicity, only the input lines 2–5 have been shown. They pass through switches 6 and 7 and through sensors 8 and 9 in the form of variable resistances whereby in the latter case, for example, comparators or the like may be provided in the control unit 1 which trigger a switching signal in case of a predetermined value of the resistance.

The input signals which are present primarily as switching signals are converted in the control unit 1 by suitable elements, for example, in the form of schematically indicated switching transistors 10 to 13 into output signals also produced as switching signals.

The output signals may be fed, for example, to load switches in the form of power transistors 10' to 13' which switch, respectively, control the electric loads 14. The loads may be relays 14 for controlling, such as by switching on or off lighting devices such as headlights 16 or for the on/off or other control of driving motors 17 and 18, for example, for a windshield cleaning, a heating installation, or may also be control lamps 19 for critical operating functions.

For the control of the portion of the electric circuits which extend from the switching transistors 10 to 13 to the load switches 10' to 13', a signal generator 20 is integrated into the control unit 1, which can produce the same output signals as the switching transistors 10 to 13. The generator 20 essentially consists of a rotary switch 21 whose input 22 can be placed for a predetermined period of time remaining at the (+)-potential with the aid of a switch 23 as command transmitter and whose outputs 24 to 27 are connected by way of diodes 28 to 31 to the connecting lines 32 to 35 between the switching transistors 10 to 13 and the load transistors 10' to 13'. The rotary switch 21 is thereby so constructed that it assumes cyclically its four positions and remains in these positions for respective short periods of time as soon as the switch 23 is closed. Additionally, a relay 36 is adapted to be energized by means of the switch 23 which respectively actuates the opening contacts 37–40 in each of the aforementioned connecting lines 32–35.

It is possible with the aid of the illustrated circuit to test the illustrated loads 16 to 19 and their coordinated load switches. For that purpose, the switch 23 is closed. The rotary switch 21 cyclically supplies the load switches 10' to 13' with (+)-potential. The functioning ability of the loads 16 to 19 and of their coordinated load switches 10' to 13' can thus be tested independently of the input signals of the control unit 1. This testing takes place optically and/or acoustically and, as a rule, without auxiliary means. Insofar as the loads and their load switches are in order, the loads are engaged in a predetermined sequence and for short periods of time. Every failure of a load or of the load switch can be recognized immediately without difficulty on the basis of a failure of this predetermined switching cycle which, as such, is the same in all vehicles, for example, of a model series.

The testing with the aid of the rotary switch 21 and with the aid of the separated connection to the input signals of the control unit, separated during this testing by the relay 36, is limited to the portion of the electric circuits more prone to failures. However, if it should be determined during this testing that the tested part of an electric circuit recognized as defective is, in fact, in order, it then necessarily follows therefrom that the failure must be looked for only in those portions of the electric circuits which extend from the input elements 6 to 9 of the control unit 1 up to the opening contacts 37 to 40. The failure search is then to be limited exclusively to this portion of the electric circuits.

In order to facilitate in particular in such a case the failure search, the input lines 2 to 5 may be connected to an indicating device 42 of any conventional construction by way of a conventional coder 41 also of any known suitable type for identifying the input signal present on lines 2–5. A separate testing of the operability of switches 6 and 7, respectively, of the sensors 8 and 9 can be carried out therewith during the test cycle with the aid of the rotary switch 21, in that the switches 6 and 7 are closed for short periods of time, and the sensors 8 and 9 are placed for short periods of time into a condition in which they engage the coordinated load with a proper functioning of the electric circuits. A code or the designation of the switch and the sensor appears on the indicating device 42 in case of a proper functioning of the switches or the sensors, and enables an indication concerning the functioning ability of the tested element. If, notwithstanding the recognized functioning ability of the switch, respectively, of the sensor and of the coordinated part of the electric circuit tested with the aid of the rotary switch 21, a failure should still exist, then the same can unequivocally exist only between the connecting place of the connecting lines to the coder 41 and the coordinated opening contacts 37 to 40.

It is thus feasible without any difficulty by means of the illustrated testing installation to localize rapidly and unequivocally any failure which has occurred. The apparatus expenditure as well as the manufacturing costs for the testing installation are negligibly small. The latter is true in particular if the control unit 1 is constructed as microprocessor; for the illustrated circuit measures can then be realized with low expenditures by software.

While we have shown and described only one embodiment in accordance with the present invention, it is understood that the same is not limited thereto but is susceptible of numerous changes and modifications as known to those skilled in the art, and we therefore do not wish to be limited to the details shown and described herein but intend to cover all such changes and modifications as are compressed by the scope of the appended claims.

We claim:

1. A test installation for testing different load means of electric circuits of a motor vehicle comprising a control unit for receiving input signals and for producing test signals, said control unit including converter means for converting said input signals into output signals for switching said different load means and generator means (20) including interrupting means (36) for interrupting said input signals and for producing test signals independently of the input signals and at least similar to the output signals and for cyclically supplying said test signals to the load means when interrupting said input signals.

2. A test installation according to claim 1, wherein the load means includes load-switching means for switching on said load means and the test signals produced by the generator means are cyclically fed to the load-switching means.

3. A test installation according to claim 2, wherein the generator means is integrated with the control unit.

4. A test installation according to claim 3, including power switch means for producing a start testing command and wherein the generator means is actuatable by said start testing command to begin cyclically supplying said test signals.

5. A test installation according to claim 4, further including indicating means for indicating the input signals of the control unit.

6. A test installation according to claim 5, further including coding means for identifying respective input signals and wherein the control unit includes input lines for conducting said input signals, each input line being connected with said coding means, said coding means being operatively connected with said indicating means to indicate said input signals.

7. A test installation according to claim 6, wherein said control unit includes lines (32–35) leading from said converter means (10–13) to said load-switching means (10'–13'), and in said power switch means (23) also being operable to actuate said interrupting means (36) for interrupting the lines.

8. A test installation according to claim 1, including power switch means for producing a start testing command and wherein the generator means is actuatable by said start testing command to begin cyclically supplying said test signals.

9. A test installation according to claim 1, further including indicating means for indicating the input signals of the control unit.

10. A test installation according to claim 9, further including coding means for identifying respective input signals and wherein the control unit includes input lines for conducting said input signals, each input line being connected with said coding means, said coding means being operatively connected with said indicating means to indicate said input signals.

11. A test installation according to claim 1, wherein said control unit includes lines (32–35) leading from said converter means (10–13) to said load-switching means (10'–13'), and said power switch means (23) for turning on the generator means, said power switch means (23) also being operable to actuate said interrupting means (36) for interrupting the lines.

* * * * *